United States Patent
Sharma et al.

(10) Patent No.: US 11,105,878 B2
(45) Date of Patent: Aug. 31, 2021

(54) SYSTEMS AND METHODS FOR IMAGE ARTIFACT REDUCTION IN SIMULTANEOUS MULTI-SLICE MAGNETIC RESONANCE IMAGING

(71) Applicant: CANON MEDICAL SYSTEMS CORPORATION, Otawara (JP)

(72) Inventors: Anuj Sharma, Mayfield Heights, OH (US); Andrew J. Wheaton, Shaker Heights, OH (US)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 220 days.

(21) Appl. No.: 15/879,916

(22) Filed: Jan. 25, 2018

(65) Prior Publication Data

US 2019/0227140 A1  Jul. 25, 2019

(51) Int. Cl.
*G01R 33/565* (2006.01)
*G01R 33/483* (2006.01)
*G01R 33/561* (2006.01)

(52) U.S. Cl.
CPC ... *G01R 33/56545* (2013.01); *G01R 33/4835* (2013.01); *G01R 33/5611* (2013.01); *G01R 33/5616* (2013.01); *G01R 33/56536* (2013.01); *G01R 33/56554* (2013.01)

(58) Field of Classification Search
CPC .......... G01R 33/56545; G01R 33/5611; G01R 33/56554; G01R 33/5616; G01R 33/4835; G01R 33/56536
See application file for complete search history.

(56) References Cited

U.S. PATENT DOCUMENTS

| 6,700,374 B1* | 3/2004 | Wu | G01R 33/56554 |
|---|---|---|---|
| | | | 324/306 |
| 2009/0046915 A1* | 2/2009 | Hou | G01R 33/56563 |
| | | | 382/131 |

(Continued)

OTHER PUBLICATIONS

K. Setsompop, et al., "Improving diffusion MRI using simultaneous multi-slice echo planar imaging", NeuroImage vol. 63, No. 1, Oct. 15, 2012, pp. 569-580.

(Continued)

*Primary Examiner* — Patrick Assouad
*Assistant Examiner* — Haidong Zhang
(74) *Attorney, Agent, or Firm* — Oblon, McClelland, Maier & Neustadt, L.L.P.

(57) ABSTRACT

A magnetic resonance imaging system includes an array radiofrequency coil and processing circuitry operatively linked to the array radiofrequency coil and configured to receive output signals from the array radiofrequency coil commensurate with a simultaneous multi-slice magnetic imaging characterized by simultaneous multi-slice parameters, estimate distorted regions of the image volume using either data obtained via a pre-scan or a pre-computed model, minimize overlap of the distorted regions with image voxels representing tissue to obtain optimized values of the simultaneous multi-slice parameters, configuring and executing the simultaneous multi-slice imaging sequence based on the optimized values of the simultaneous multi-slice parameters, and reconstruct simultaneous multi-slice images with minimized artifacts.

19 Claims, 5 Drawing Sheets

(56) References Cited

U.S. PATENT DOCUMENTS

| | | | |
|---|---|---|---|
| 2010/0239151 A1* | 9/2010 | Dannels | G01R 33/243 382/131 |
| 2011/0254548 A1 | 10/2011 | Setsompop et al. | |
| 2015/0285885 A1* | 10/2015 | Feiweier | G01R 33/36 324/309 |
| 2015/0309142 A1* | 10/2015 | Li | G01R 33/5611 324/309 |
| 2016/0307301 A1 | 10/2016 | Zhou et al. | |

OTHER PUBLICATIONS

Yi Wang, et al., "Simultaneous Multi-slice Turbo-FLASH imaging with CAIPIRINHA for Whole Brain Distortion-Free Pseudo-Continuous Arterial Spin Labeling at 3 and 7T", NeuroImage, vol. 113, Jun. 2015, pp. 279-288.

Markus Barth, et al., "Simultaneous Multislice (SMS) Imaging Techniques", Magnetic Resonance in Medicine, Imaging Methodology—Review, vol. 75, 2016, pp. 63-81.

David J. Larkman, PhD., et al., "Use of Multicoil Arrays for Separation of Signal from Multiple Slices Simultaneously Excited", Journal of Magnetic Resonance Imaging, vol. 13, 2001, pp. 313-317.

Kawin Setsompop, et al., "Blipped-Controlled Aliasing in Parallel Imaging for Simultaneous Multislice Echo Planar Imaging with Reduced g-Factor Penalty", Magnetic Resonance in Medicine, Imaging Methodology—Full Papers, vol. 67, 2012, pp. 1210-1224.

Stephen F. Cauley et al., "Interslice leakage artifact reduction technique for simultaneous multislice acquisitions", Magnetic Resonance in Medicine, vol. 72, Issue 1, Jul. 2014, pp. 93-102 (Abstract only).

* cited by examiner

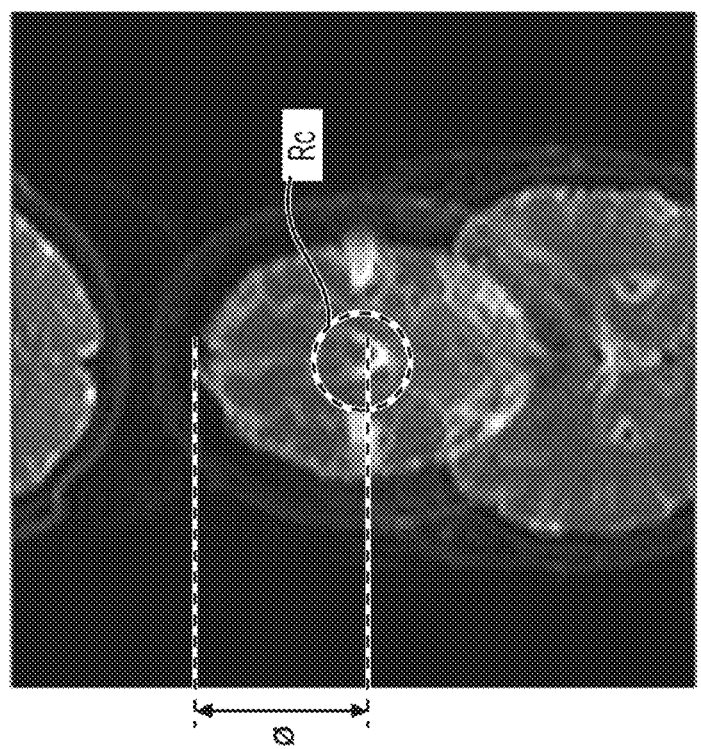
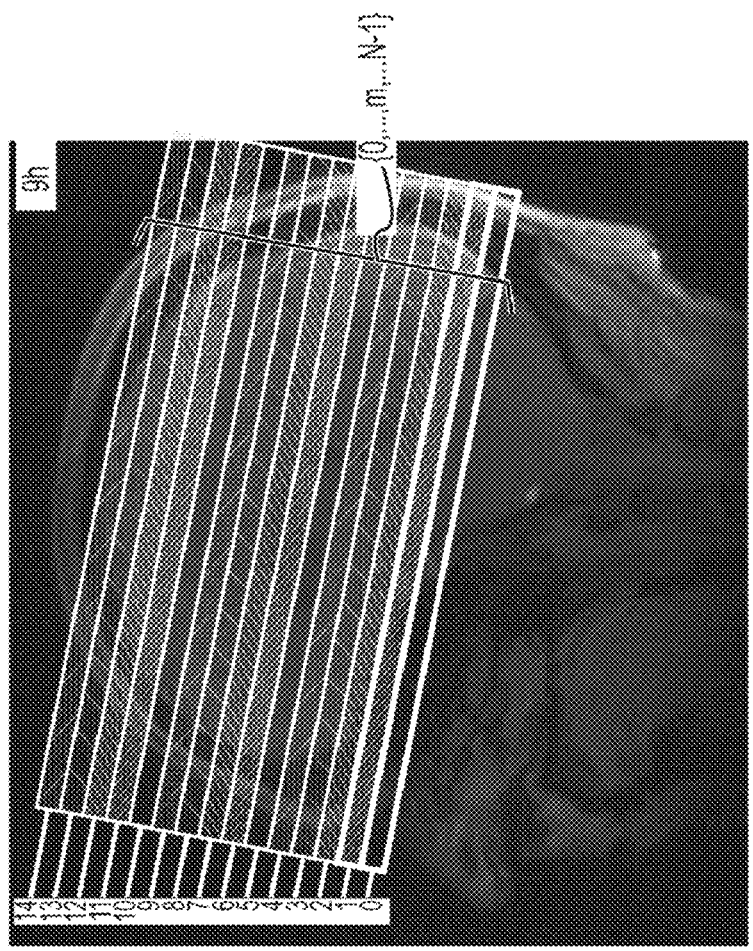
FIG. 2A
FIG. 2B

SYSTEMS AND METHODS FOR IMAGE ARTIFACT REDUCTION IN SIMULTANEOUS MULTI-SLICE MAGNETIC RESONANCE IMAGING

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Magnetic resonance imaging (MRI) is an imaging scan method that magnetically excites nuclear spins of a subject placed in a magnetostatic field by a radio frequency (RF) pulse having a Larmor frequency thereof, to generate an image from magnetic resonance signal data generated with the excitation.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 2A is a schematic view of a plurality of slices scanned on a patient, according to certain aspects of the disclosure;

FIG. 2B is a schematic view of two slices of the plurality of slices spatially shifted relative to each other, according to certain aspects of the disclosure;

DETAILED DESCRIPTION

Figure 1:
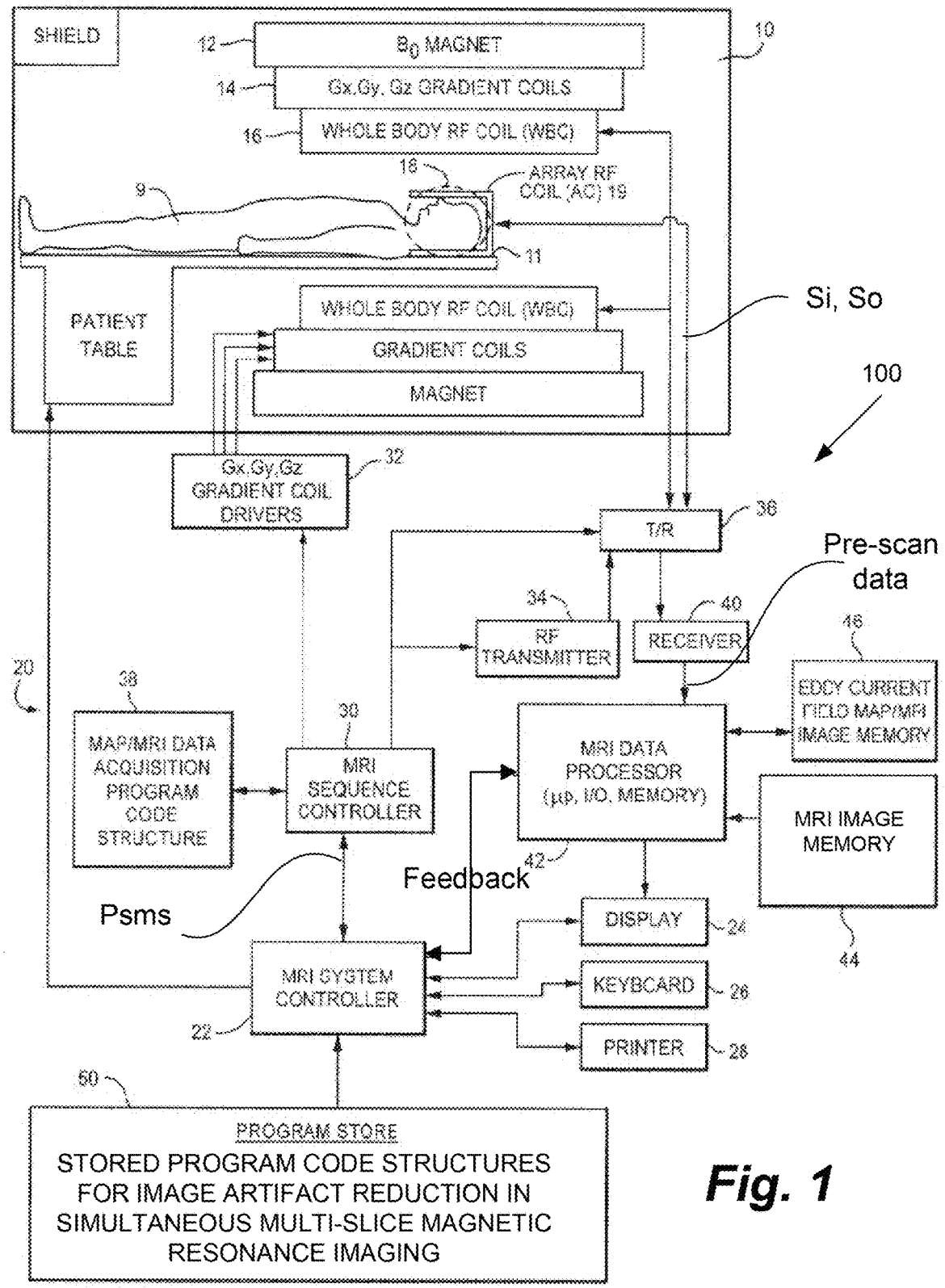
FIG. 1 is a schematic view of an exemplary MRI system, according to certain aspects of the disclosure.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

According to embodiments of the disclosed subject matter, a magnetic resonance imaging system includes array radiofrequency coil, and processing cicrcuitry operatively linked to the array radiofrequency coil and configured to receive output signals from the array radiofrequency coil commensurate with a simultaneous multi-slice magnetic resonance imaging characterized by simultaneous multi-slice parameters and an image volume, estimate distorted regions within image volume, minimize overlap of the distorted regions with image voxels of the image volume representing tissue to obtain optimized values of the simultaneous multi-slice parameters, configure and execute a simultaneous multi-slice imaging sequence based on the optimized values of the simultaneous multi-slice parameters, and reconstruct simultaneous multi-slice images with limited artifact presence in the multi-slice images.

Simultaneous multi-slice (SMS) imaging techniques can simultaneously excite a plurality of slice positions with one RF pulse, and each slice excited can be reconstructed as a separate image (e.g., one image for each slice position). The reconstruction of images is performed via image reconstruction methods using parallel imaging techniques (e.g. SENSE, GRAPPA). These image reconstruction methods rely on SMS sequence parameters (e.g. slice shift, multi-band factor, and/or stack combination/slice arrangement) that are kept fixed and uniform throughout the plurality of slices.

Although SMS imaging techniques and their associated reconstruction methods can reduce scan times and increase the number of slices, current approaches to SMS imaging techniques include various drawbacks and limitations.

SMS image reconstruction methods utilize the localized spatial sensitivity maps of multi-channel receive coils to separate the slices either in k-space (e.g. GRAPPA) or image space (e.g. SENSE). Image artifacts can occur if the image data does not spatially align with the coil sensitivity maps. This mismatch can occur in regions of image distortion, for example, near air-tissue interfaces such as frontal sinuses and the ear canal. These artifacts manifest as image pixel intensity values of one slice transferred to another slice and are commonly called 'slice-leakage' artifacts. Slice-leakage artifacts can appear as coherent, sharp edges that are highly localized and asymmetric. Thus it is difficult to 'look through' these artifacts which can lead to incorrect disease diagnosis.

As further described herein, methods to limit the presence of these artifacts is presented. These methods limit the presence of the artifacts appearance by implementing a variation and optimization of the SMS sequence parameters throughout the plurality of slices.

Referring now to the drawings, wherein like reference numerals designate identical or corresponding parts throughout the several views, FIG. 1 depicts an exemplary overview of a magnetic resonance imaging (MRI) system 100 according to one or more aspects of the disclosed subject matter. The MRI system 100 includes a gantry 10 (shown in schematic cross section) and various related system components interfaced therewith. At least the gantry 10 is typically located in a shielded room. One MRI system geometry depicted in FIG. 1 includes a substantially coaxial cylindrical arrangement of the static field $B_0$ magnet 12, a Gx, Gy, and Gz gradient coil set 14 and a large whole body RF coil (WBC) assembly 16. The physical Gx, Gy, and Gz gradient axes can be controlled in such a way to create $G_{RO}$, $G_{PE}$, and $G_{SS}$(readout, phase encode, slice-selection) functional axes. Along the horizontal axis of the cylindrical array of elements is an imaging volume 18 shown as substantially encompassing the head of a patient 9 supported by a patient table 11. A smaller RF coil 19 is shown as more closely coupled to the head of the patient 9 in image volume 18. RF coil 19 can be a surface coil or array or the like, and can be customized or shaped for particular body parts, such as skulls, arms, shoulders, elbows, wrists, knees, legs, chests, spines, etc. An MRI system controller 22 interfaces with MRI sequence controller 30, which, in turn controls the Gx, Gy, and Gz gradient coil drivers 32, as well as the RF transmitter 34 and the transmit/receive switch 36 (if the same RF coil is used for both transmission and reception). The MRI sequence controller 30 includes suitable program code structure 38 for implementing data acquisition sequences including a SMS pulse sequence, for example. The MRI system controller 22 is connected to stored program store 50 which contains the program code structure to compute optimized sequence parameters that minimize artifacts in SMS images. The MRI system controller 22 also can optionally interface with a printer 28, a keyboard 26, and a display 24.

The various related system components include an RF receiver 40 providing input to data processor 42, which is configured to create processed image data, which is then sent to display 24. The MRI data processor 42 is also configured for access to previously acquired data acquisitions of pulse sequences stored in MRI image memory 44.

Also illustrated in FIG. 1 is a generalized depiction of an MRI system program store (memory) 50 where stored program code structures (e.g., for defining graphical user interfaces and accepting operator inputs to the graphical user interface, etc.) are stored in non-transitory computer-readable storage media accessible to the various data processing components of the MRI system. The program store 50 may be segmented and directly connected, at least in part, to different elements of the various related system components as needed.

FIG. 1 depicts a simplified diagram of an MRI system with some modifications so as to practice exemplary embodiments described herein. The system components can be divided into different collections of "boxes" and can include numerous digital signal processors, microprocessors, and special-purpose processing circuits that are configured to perform, for example, fast analog/digital conversions, Fourier transforms, and array processing. Each of these processing circuits can be a clocked "state machine" wherein the physical data processing circuits progress from one physical state to another upon the occurrence of each clock cycle (or predetermined number of clock cycles.)

Not only can the physical state of the processing circuits (e.g., CPU's, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a SMS imaging reconstruction process, an array of computer-readable accessible data value storage sites in physical storage media will be transformed from some prior state (e.g., all uniform "zero values to all "one" values) to a new state, wherein the physical states at the physical sites of such an array vary between minimum and maximum values to represent real world physical events and conditions (e.g., the internal physical structures of a patient over an imaged volume space). Such arrays of stored data values represent and also constitute a physical structure—as does a particular structure of computer control program codes that, when sequentially loaded into instruction registers and executed by one or more CPUs of the various related system components, causes a particular sequence of operational states to occur and be transitioned through within the MRI system.

FIGS. 2A-2B are a schematic view of a plurality of scan slices {0, ..., m, ..., N−1} scanned on a patient 9 and two simultaneously acquired slices {m, n} of the plurality of scan slices {0, ..., m, ..., N−1} shifted in-plane from each other, according to certain aspects of the disclosure.

The MRI sequence controller 30 is configured to send to the array RF coil 19 through the RF transmitter 34 and the transmit/receive switch 36 input signals Si while the MRI data processor 42 is configured to receive from the receiver 40 and the transmit/receive switch 36 output signals So. The input and output signals Si, So are commensurate with performing a scan on the patient 9 though a simultaneous multi-slice (SMS) imaging method. The SMS imaging method relies on scanning a head portion 9h of the patient 9 through a plurality of scan slices {0, ..., m, ..., N−1} grouped in a plurality of stacks, characterized by scan parameters Ps and SMS sequence parameters Psms, as illustrated in FIGS. 2A-2B.

The scan parameters Ps can include a number of slices N and a field of view FOV, while the SMS sequence parameters Psms can include a slice shift ϕ, the multi-band factor MB, and stack combinations Cstack.

The MRI data processor 42 is configured to receive data from Receiver 40, access the program store 50 through the MRI System Controller 22, perform optimization of the SMS sequence parameters Psms to prevent appearance of artifacts in SMS images, and communicate the optimized SMS sequence parameters Psms to MRI Sequence Controller 30 through the MRI System Controller 22.

The MRI sequence controller 30 is configured to execute the SMS imaging sequence with the optimized parameters Psms.

The MRI data processor 42 is configured to receive the output signal So acquired using the optimized SMS sequence parameters Psms, perform SMS image reconstruction, and display the SMS images.

Figure 3:
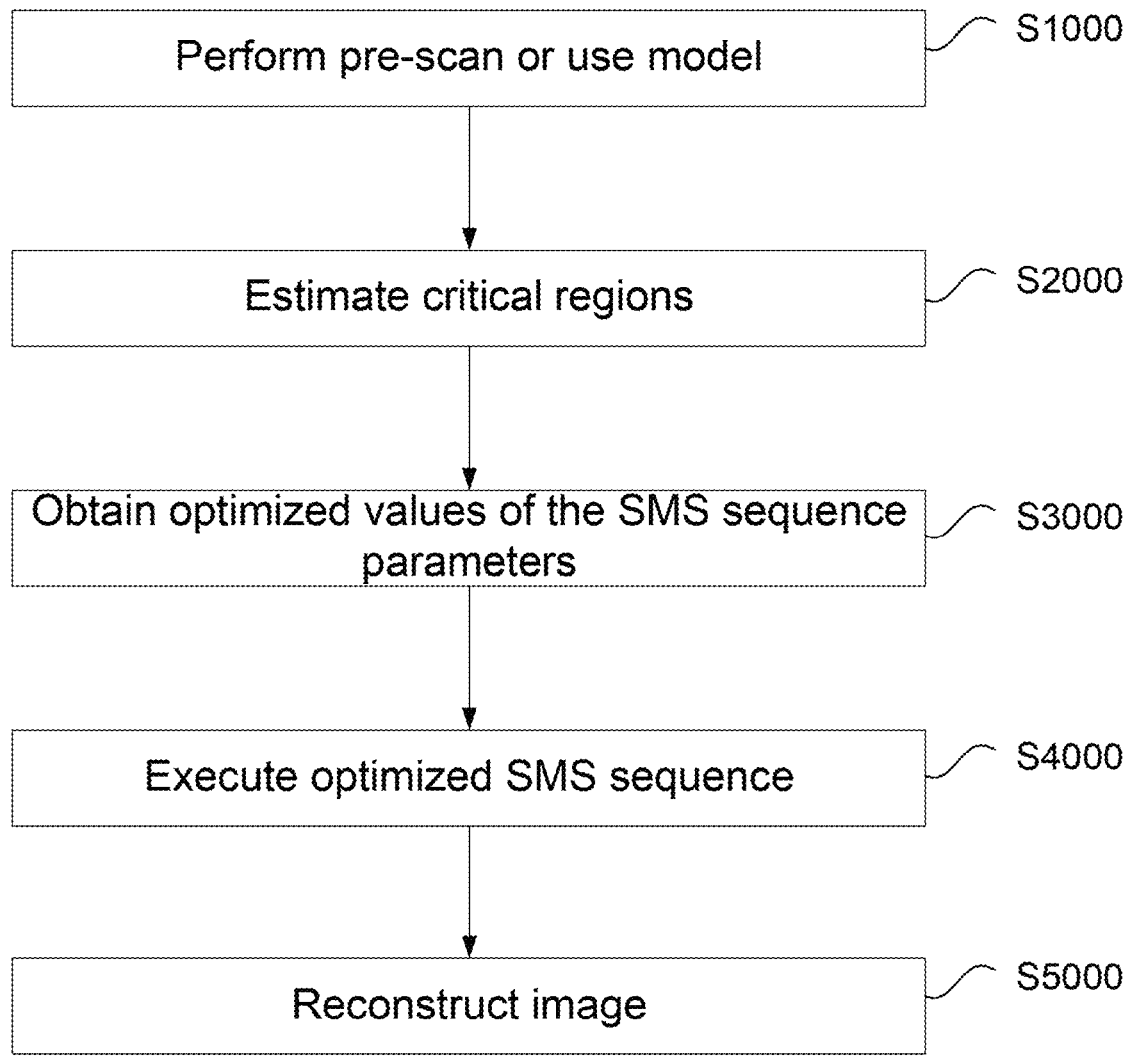
FIG. 3 is an algorithmic flow chart for reducing artifacts in a simultaneous multi-slice magnetic resonance imaging process, according to certain aspect of the disclosure.

FIG. 3 is an algorithmic flow chart for preventing the appearance of the artifacts in the simultaneous multi-slice magnetic resonance imaging process, according to certain aspects of the disclosure.

In a step S1000, a pre-scan is performed through software instructions executed on the MRI system controller 22 and/or the MRI data processor 42. The pre-scan includes data acquisition using, for example, a low resolution gradient-recalled multi-echo imaging sequence to estimate off-resonance frequency maps dF. For scan efficiency, instead of acquiring pre-scan data, a model of the off-resonance regions can be defined based on image data acquired on a large cohort of human volunteers.

The main source of artifacts in SMS images reconstructed using image-space methods such as SENSE is the spatial mismatch of coil sensitivity maps and the main scan images. The primary source of these mismatches is image distortion. Specially, SMS methods typically employ echo-planar imaging (EPI) sequence for the main data acquisition which generates large image distortions due to low-bandwidth readout in the phase-encode direction of EPI. The coil sensitivity maps are commonly acquired using the gradient-recalled echo (GRE) sequence which generates minimal image distortion due to the high-bandwidth readout of GRE. Therefore, there is commonly a spatial mismatch between the main EPI images and the coil sensitivity maps.

Image distortion and thus coil map mismatch is highly pronounced in regions of high and inhomogeneous magnetic field gradients such as at air-tissues interfaces in the frontal sinuses and the ear canal. Thus these regions produce the most artifacts in SMS images. These regions constitute the said critical regions Rc which show significantly higher off-resonance frequency dF values than the surrounding tissue.

In a step S2000, critical regions Rc (see FIG. 2B) where artifacts might appear are estimated. The estimation of the critical regions Rc can be performed manually by the operator through visual inspection of the off-resonance frequency maps dF in the plurality of scan slices $\{0, \ldots, m, \ldots, N-1\}$ resulting from the pre-scan and/or model and displayed on the display 24. Alternatively, the critical regions Rc can be calculated automatically through software instructions executed on the MRI system controller 22 and/or the MRI data processor 42. The critical regions Rc can be estimated by comparing values of the off-resonance frequency maps dF to predetermined threshold values. The predetermined threshold values can be manually set or automatically calculated through a set of software instructions executed on the MRI data processor 42.

In a step S3000, the process is configured to obtain optimized values of the SMS sequence parameters Psms. The step S3000, is further described in the following paragraphs and in FIG. 4.

In a step S4000, the SMS imaging sequence is executed with the optimized parameters Psms and k-space data is acquired from a plurality of SMS slices $\{0, \ldots, m, \ldots, N-1\}$. In a step S5000, a plurality of SMS images $Im_{\{0, \ldots, m, \ldots, N-1\}}$ is reconstructed from the plurality of scan slices $\{0, \ldots, m, \ldots, N-1\}$. The reconstruction of the plurality of SMS images $Im_{\{0, \ldots, m, \ldots, N-1\}}$ can be performed through software instructions executed on the MRI data processor 42 and based on any reconstruction methods, such as methods based on image space (e.g., SENSE), K space (e.g., GRAPPA), or hybrid space (e.g., ARC).

In addition, the optimized values of the SMS sequence parameters Psms can be stored in a memory, a library, and/or a database of the MRI data processor 42, and/or MRI system controller 22 (e.g., the program store 50 and/or the MRI image memory 44).

Figure 4:
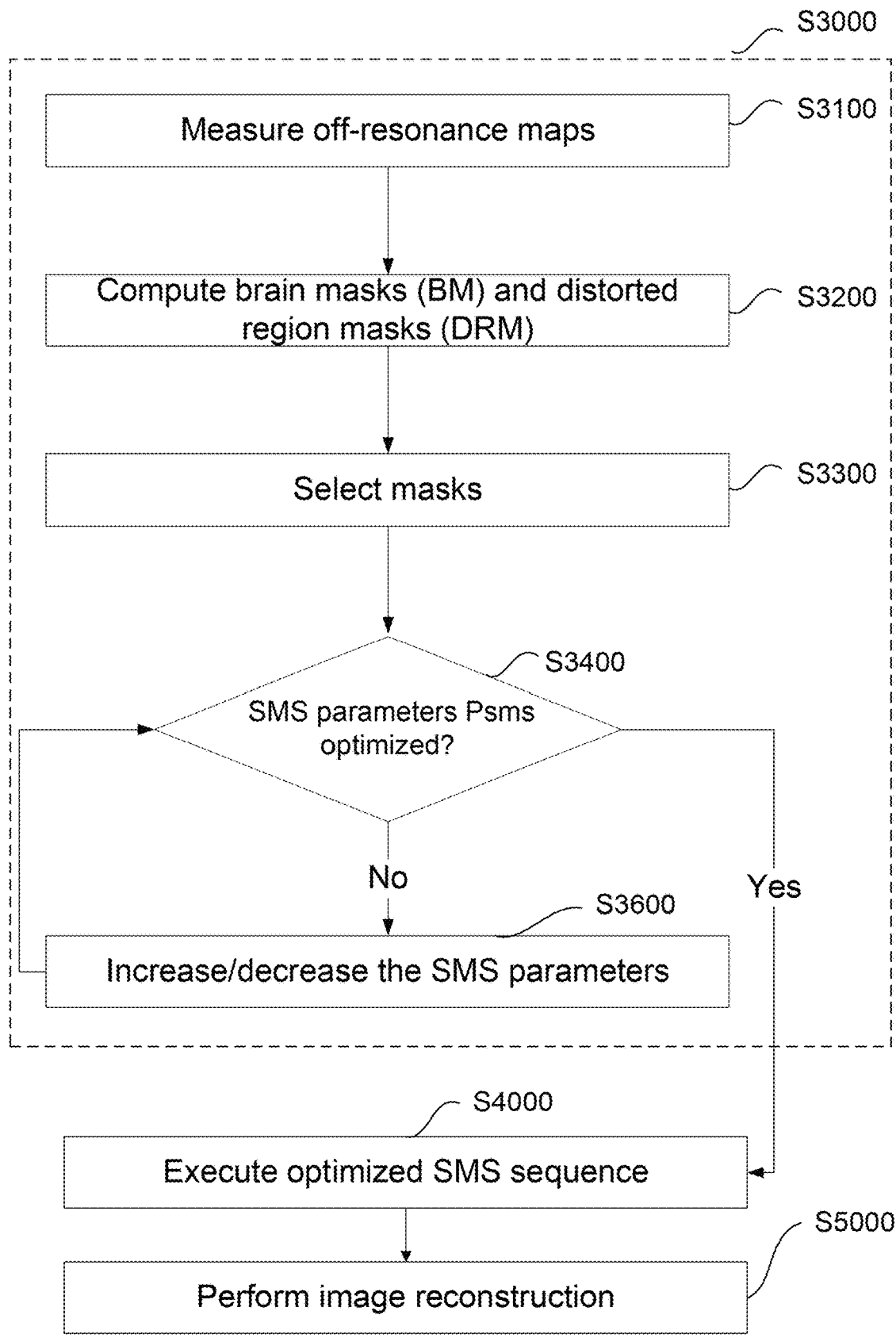
FIG. 4 is an algorithmic flow chart for obtaining the optimized values of SMS sequence parameters Psms, according to certain aspects of the disclosure.

FIG. 4 is an algorithmic flow chart for obtaining the optimized values of the SMS sequence parameters Psms, according to certain aspects of the disclosure.

In a step S3100, a plurality of off-resonance frequency maps $dF_{\{0, \ldots, m, \ldots, N-1\}}$ is generated for the plurality of scan slices $\{0, \ldots, m, \ldots, N-1\}$ to indicate an amount of distortion on each slice $\{m\}$ of the plurality of scan slices $\{0, \ldots, m, \ldots, N-1\}$. For example, software instructions can be executed by the MRI data processor 42 to associate, to each pixel image of each scan slice, $\{m\}$ a distortion intensity $\Delta fo$. Since image distortion is directly proportional to off-resonance frequency, the magnitude of the off-resonance maps dF can be directly utilized as a measure of distortion intensity.

In a step S3200, brain masks BM and distorted region masks DRM are computed for the plurality of scan slices $\{0, \ldots, m, \ldots, N-1\}$. The brain masks BM and the distorted region masks DRM can be computed through software instructions executed on the MRI data processor 42 by applying, on the plurality of off-resonance maps $dF_{\{0, \ldots, m, \ldots, N-1\}}$, predetermined thresholds.

For the brain masks BM, the predetermined thresholds can include a plurality of independent thresholds $IT_{\{0, \ldots, m, \ldots, N-1\}}$, wherein each independent threshold $IT_{\{m\}}$ of the plurality of independent thresholds $IT_{\{0, \ldots, m, \ldots, N-1\}}$ is selected independently for each scan slice $\{m\}$. For example, each independent threshold $IT_{\{m\}}$ can be based on a local maximum image intensity value on each pre-scan image $P_{\{m\}}$ of the plurality of pre-scan images $P_{\{0, \ldots, m, \ldots, N-1\}}$.

For the distorted region masks DRM, the predetermined thresholds can include a dependent threshold DT selected jointly across the plurality of scan slices $\{0, \ldots, m, \ldots, N-1\}$. For example, the dependent threshold DT can be based on a global maximum distortion value over the plurality of off-resonance maps $dF\{0, \ldots, m, \ldots, N-1\}$.

In a step S3300, for each scan slice $\{M\}$ a slice mask $I_m$ is selected between the brain masks BM and the distorted region masks DRM. The step S3300 is further described in the following paragraphs and in FIG. 5.

In a step S3400, it is determined if the values of the SMS sequence parameters Psms are optimized.

The determination that the values of the SMS sequence parameters Psms are optimized can be performed through software instructions executed on the MRI data processor 42.

For example, the MRI data processor 42 can be configured to execute software instructions that compute a cost function C over the plurality of scan slices $\{0, \ldots, m, \ldots, N-1\}$ and the SMS sequence parameters Psms, and compare the cost function C to a predetermined cost threshold Co.

For example, if the cost function C is less than the predetermined cost threshold Co, it is determined that the values of the SMS sequence parameters Psms are optimized.

For example, the cost function C can be expressed as:

$$C = \min_{Psms} \Sigma_{m=0}^{N-1} I_m(x - S_m) \forall x \in X_m,$$

wherein $I_m$ is the slice mask of the scan slice $\{m\}$ selected in step S3300, x is the spatial variable (e.g., element of the pixel matrix image corresponding to the scan slice $\{m\}$) $S_m$ is the spatial units by which the scan slice {m} is shifted, $X_m$ is the spatial index where the slice mask $I_m$ is positive and non-null, an $$\min_{Psms}$$

corresponds to the minimum over the SMS sequence parameters Psms.

If it is determined that the values of the SMS sequence parameters Psms are optimized, the process goes to step S4000. Otherwise, the process goes to step S3600.

In step S3600, the values of the SMS sequence parameters Psms are adjusted (e.g., increased and/or decreased). The adjustment of the values of the SMS sequence parameters Psms can be performed manually by the operator via input data entered through the keyboard 26 and/or graphical user interface instructions executed by the MRI system controller 22 and displayed on the display 24, and/or automatically via software instructions executed by the MRI data processor 42 that increase and/or decrease the values of the SMS sequence parameters Psms by predetermined increments stored in a memory, library, and/or database of the MRI data processor 42.

The adjustment of the SMS sequence parameters Psms for each scan slice {m} and notably the values of the slice shift φ, the multi-band factor MB, and the stack combinations Cstack between the plurality of scan slices {0, . . . , m, . . . , N−1} can depend on locations of the scan slice {M}.

In one example, scan slices substantially close to distorted regions (e.g., nasal cavity, and/or ear canal as illustrated by the scan slice {0} and {1} in FIG. 2A) can be acquired with a multi-band factor MB value of 1 (i.e., without slice-acceleration) while the remaining scan slices can be acquired with a multi-band factor MB value of 2 (i.e., twice slice-accelerated) to avoid leakage of the pixel images of the distorted regions to the remaining scan slices and the appearance of the artifacts.

In another example, the stack combinations Cstack can be modified to pair scan slices substantially close to the distorted regions with scan slices substantially close to undistorted region (e.g., top of the head 9h as illustrated by slice {N−2} and/or {N−1} in FIG. 2A).

In another example, the slice shift φ can be adjusted to prevent distorted regions of each scan slice {m} from leaking to the other scan slice {n} by limiting overlap of distorted regions between slices {m} and {n}.

Figure 5:
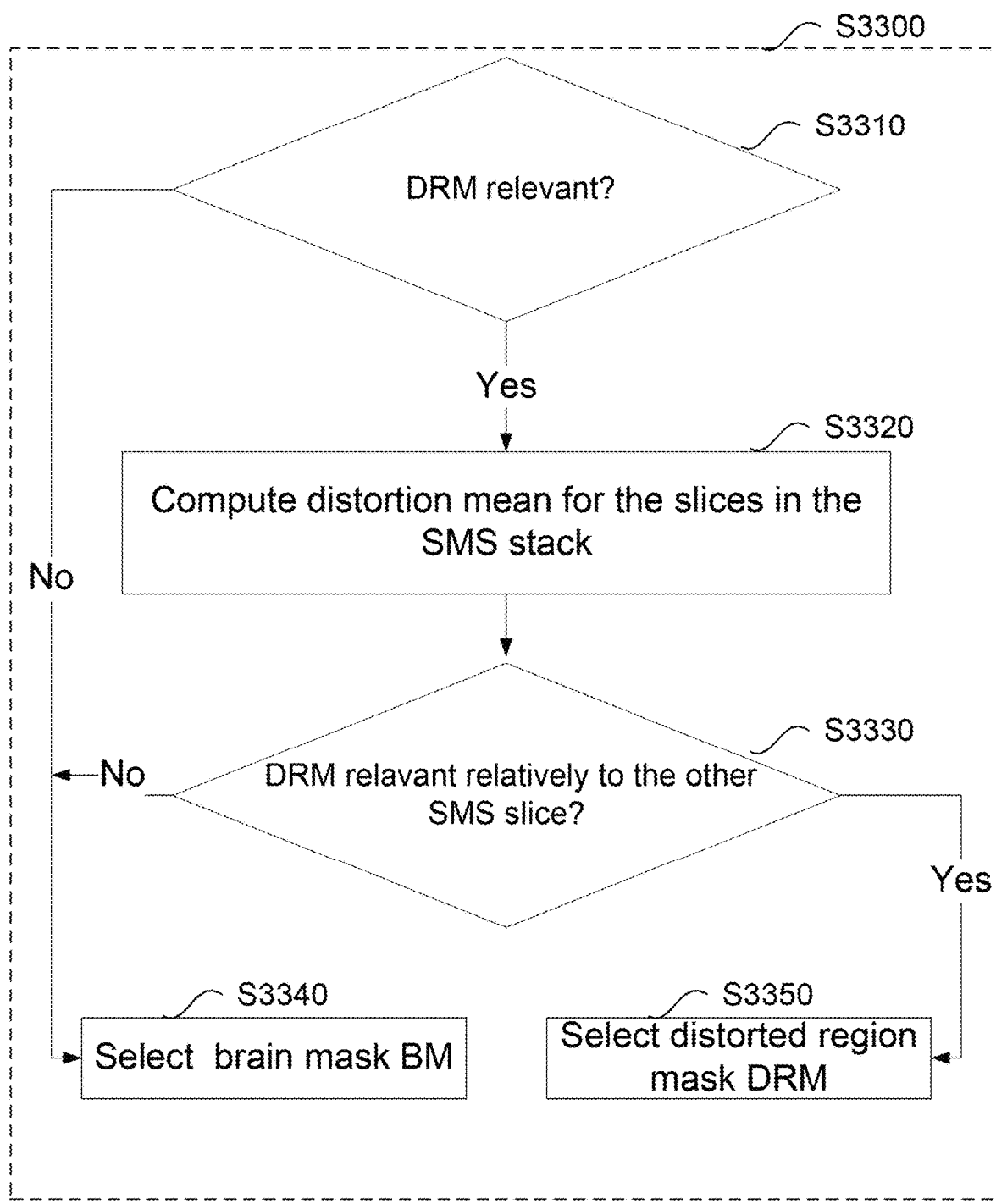
FIG. 5 is an algorithmic flow chart for selecting a slice mask, according to certain aspects of the disclosure.

FIG. 5 is an algorithmic flow chart for selecting the slice mask Im, according to certain aspects of the disclosure.

In a step S3310, for each scan slice {m} it is determined if the distorted region mask DRM is relevant. For example, the distorted region mask DRM can be determined as relevant if the distorted region mask DRM is a closed two-dimensional space with an area larger than a predetermined minimum area threshold.

The determination of the relevance of the distorted region mask DRM can be performed manually by the operator via visual inspection of the scan slice {m} displayed on the display 24 and/or graphical user interface instructions executed by the MRI system controller 22, and/or automatically via software instructions executed by the MRI data processor 42 that verify that the distorted region mask DRM is a closed two-dimensional space with an area larger than the predetermined minimum area threshold. For example, the predetermined minimum area threshold can be determined based on analyzing a set of off-resonance maps dF from a cohort of human volunteers.

If it is determined than the distorted region mask DRM is relevant, the process goes to a step S3320. Otherwise, the process goes to a step S3340.

In the step S3320, distortion means for the scan slice {m} and other scan slices {n} in the same SMS stack Cstack are computed through software instructions executed on the MRI data processor 42. For example, the distortion mean for the scan slice {m} can correspond to the mean of the off-resonance maps $dF_{\{m\}}$ over the scan slice {m}.

In a step S3330, it is determined if the distorted region mask DRM of the scan slice {m} is relevant in relation to the other scan slice {n} in the SMS stack Cstack. For example, the distorted region mask DRM of the scan slice {m} can be determined as relevant in relation to the other scan slice {n} if the distortion mean of the scan slice {m} is larger than the distortion mean of the other scan slice {n}.

If it is determined that the distorted region mask DRM of the scan slice {m} is relevant in relation to the other scan slice {n}, the process goes to a step S3350. Otherwise, the process goes to the step S3340.

In the step S3340, the brain mask BM is selected as the slice mask Im.

In the step S3350, the distorted region mask DRM is selected as the slice mask Im.

The MRI system 100 includes various advantages. For example, the MRI system 100, and more specifically the process described in FIGS. 3-5, can reduce the artifacts to provide more accurate SMS images and enable more precise diagnostics.

In addition, the process described in FIGS. 3-5 to reduce the artifacts is independent of the method for reconstructing SMS images and can be employed in conjunction with conventional reconstruction methods (e.g. SENSE, GRAPPA, and/or ARC).

Finally, the process described in FIGS. 3-5 to reduce the artifacts provides optimized values for the SMS sequence parameters Psms that can be stored and used a posteriori with other patients having similar morphologies as the scanned patient (e.g., age, weight, head volume, and/or head geometry).

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A magnetic resonance imaging system, comprising:
an array radio frequency coil; and
processing circuitry operatively linked to the array radio frequency coil and configured to receive output signals from the array radiofrequency coil commensurate with a simultaneous multi-slice magnetic resonance imaging characterized by simultaneous multi-slice parameters and an image volume, estimate regions within the image volume, determine optimized values of the simultaneous multi-slice parameters that minimize overlap between the regions in one slice and image voxels of the image volume representing tissue in another slice, configure and execute a simultaneous multi-slice imaging sequence based on the optimized values of the simultaneous multi-slice parameters, and reconstruct simultaneous multi-slice images with reduced artifact in the image volume representing the tissue in the simultaneous multi-slice images, wherein the optimized values of the simultaneous multi-slice parameters are determined by the processing circuitry minimizing a cost function depending on a slice mask.

2. The magnetic resonance imaging system of claim 1, wherein the simultaneous multi-slice parameters optimized by the processing circuitry include at least one of slice shifts, multi-band factors, and stack combinations.

3. The magnetic resonance imaging system of claim 1, wherein the processing circuitry is further configured to estimate the regions based on pre-scan data.

4. The magnetic resonance imaging system of claim 3, wherein the processing circuitry is further configured to compute off-resonance frequency maps of the pre-scan data, compute masks based on the off-resonance frequency maps, and select the slice mask from the computed masks commensurate with the reduced artifact.

5. The magnetic resonance imaging system of claim 4, wherein the masks computed by the processing circuitry include brain masks and distortion region masks.

6. The magnetic resonance imaging system of claim 1, wherein the optimized values of the simultaneous multi-slice parameters determined by the processing circuitry are stored in a memory.

7. A method of magnetic resonance imaging, comprising:

receiving output signals from an array radiofrequency coil commensurate with a simultaneous multi-slice magnetic resonance imaging characterized by simultaneous multi-slice parameters and an image volume;

estimating regions within the image volume;

determining optimized values of the simultaneous multi-slice parameters that minimize overlap between the regions in one slice and image voxels of the image volume representing tissue in another slice;

configuring and executing a simultaneous multi-slice imaging sequence based on the optimized values of the simultaneous multi-slice parameters; and reconstructing simultaneous multi-slice images with reduced artifact in the image volume representing the tissue in the simultaneous multi-slice images, wherein the determining comprises minimizing a cost function that depends on a slice mask to determine the optimized values of the simultaneous multi-slice parameters.

8. The method of claim 7, wherein the simultaneous multi-slice parameters include at least one of slice shifts, multi-band factors, and stack combinations.

9. The method of claim 7, wherein the estimating comprises estimating the regions within the image volume based on pre-scan data.

10. The method of claim 9, further comprising:

computing off-resonance frequency maps of the pre-scan data;

computing masks based on the off-resonance frequency maps; and selecting the slice mask from the computed masks commensurate with the reduced artifact.

11. The method of claim 10, wherein the masks include brain masks and distortion region masks.

12. The method of claim 7, further comprising storing the optimized values of the simultaneous multi-slice parameters in a memory.

13. A non-transitory computer-readable storage medium storing computer-readable instructions which, when executed by a computer, cause the computer to perform a method, comprising:

receiving output signals from an array radiofrequency coil commensurate with a simultaneous multi-slice magnetic imaging characterized by simultaneous multi-slice parameters an image volume;

estimating regions within the image volume;

determining optimized values of the simultaneous multi-slice parameters that minimize overlap between the regions in one slice and image voxels of the image volume representing tissue in another slice;

configuring and executing a simultaneous multi-slice imaging sequence based on the optimized values of the simultaneous multi-slice parameters; and reconstructing simultaneous multi-slice images with reduced artifact in the image volume representing the tissue in the simultaneous multi-slice images, wherein the determining comprises minimizing a cost function that depends on a slice mask to determine the optimized values of the simultaneous multi-slice parameters.

14. The non-transitory computer-readable storage medium of claim 13, wherein the simultaneous multi-slice parameters include at least one of slice shifts, multi-band factors, and stack combinations.

15. The non-transitory computer-readable storage medium of claim 13, wherein the estimating comprises estimating the regions within the image volume based on pre-scan data.

16. The non-transitory computer-readable storage medium of claim 15, the method further comprising:

computing off-resonance maps of the pre-scan data;

computing masks based on the off-resonance maps; and selecting the slice mask from the computed masks commensurate with the reduced artifact.

17. The non-transitory computer-readable storage medium of claim 16, wherein the masks include brain masks and distortion region masks.

18. A magnetic resonance imaging system, comprising:

an array radio frequency coil; and processing circuitry operatively linked to the array radiofrequency coil and configured to receive output signals from the array radiofrequency coil commensurate with a simultaneous multi-slice magnetic resonance imaging characterized by simultaneous multi-slice parameters and an image volume, estimate regions within the image volume, determine optimized values of the simultaneous multi-slice parameters that minimize overlap between the regions in one slice and image voxels of the image volume representing tissue in another slice, configure and execute a simultaneous multi-slice imaging sequence based on the optimized values of the simultaneous multi-slice parameters, and reconstruct simultaneous multi-slice images with reduced artifact in the image volume representing the tissue in the simultaneous multi-slice images, wherein the simultaneous multi-slice parameters optimized by the processing circuitry include stack combinations, and wherein the processing circuitry is configured to set the stack combinations such that slices substantially close to the regions are paired with slices substantially close to other regions which are not the regions.

19. A magnetic resonance imaging system, comprising:

an array radio frequency coil; and processing circuitry operatively linked to the array radiofrequency coil and configured to receive output signals from the array radiofrequency coil commensurate with a simultaneous multi-slice magnetic resonance imaging characterized by simultaneous multi-slice parameters and an image volume, estimate distorted regions within the image volume, minimize overlap of the distorted regions with image voxels of the image volume representing tissue to obtain optimized values of the simultaneous multi-slice parameters, configure and execute a simultaneous multi-slice imaging sequence based on the optimized values of the simultaneous multi-slice parameters, and reconstruct simultaneous multi-slice images with reduced artifact presence in the multi-slice images, wherein the optimized values of the simultaneous multi-slice parameters are obtained by the processing circuitry minimizing a cost function depending on a slice mask.

* * * * *